United States Patent
Wang et al.

(10) Patent No.: US 11,652,164 B2
(45) Date of Patent: May 16, 2023

(54) IGBT AND MANUFACTURING METHOD THEREFOR

(71) Applicant: GTA Semiconductor Co., LTD., Shanghai (CN)

(72) Inventors: Xueliang Wang, Shanghai (CN); Jianhua Liu, Shanghai (CN); Jinrong Lang, Shanghai (CN); Yaneng Min, Shanghai (CN)

(73) Assignee: GTA Semiconductor Co., Ltd., Shanghai (CN)

( * ) Notice: Subject to any disclaimer, the term of this patent is extended or adjusted under 35 U.S.C. 154(b) by 54 days.

(21) Appl. No.: 17/259,961

(22) PCT Filed: Jun. 12, 2019

(86) PCT No.: PCT/CN2019/090835
§ 371 (c)(1),
(2) Date: Jan. 13, 2021

(87) PCT Pub. No.: WO2020/038079
PCT Pub. Date: Feb. 27, 2020

(65) Prior Publication Data
US 2021/0313457 A1    Oct. 7, 2021

(30) Foreign Application Priority Data
Aug. 23, 2018 (CN) .......................... 201810967106.7

(51) Int. Cl.
*H01L 29/06* (2006.01)
*H01L 29/66* (2006.01)
(Continued)

(52) U.S. Cl.
CPC ...... *H01L 29/7393* (2013.01); *H01L 29/0611* (2013.01); *H01L 29/1095* (2013.01); *H01L 29/66325* (2013.01)

(58) Field of Classification Search
CPC ............ H01L 29/7393; H01L 29/0611; H01L 29/0804; H01L 29/0821; H01L 29/0615;
(Continued)

(56) References Cited

U.S. PATENT DOCUMENTS

| 2014/0284621 A1 | 9/2014 | Shimizu et al. |
| 2016/0035836 A1* | 2/2016 | Konstantinov ......... H01L 29/74 257/77 |
| 2016/0035868 A1* | 2/2016 | Naito .................... H01L 29/083 438/138 |

FOREIGN PATENT DOCUMENTS

| CN | 104064587 A | 9/2014 |
| CN | 106024933 A | 10/2016 |

(Continued)

OTHER PUBLICATIONS

International Search Report from PCT Application No. PCT/CN2019/090835 dated Aug. 23, 2019 (4 pages).
Written Opinion from PCT Application No. PCT/CN2019/090835 dated Aug. 23, 2019 (3 pages).
(Continued)

*Primary Examiner* — Natalia A Gondarenko
(74) *Attorney, Agent, or Firm* — Harness, Dickey & Pierce, P.L.C.

(57) ABSTRACT

An IGBT and a manufacturing method therefor, wherein a target region in the IGBT is doped with first ions; the target region comprises at least one of a P-type substrate (11), a P-type well region (13), and a P-type source region (14); and the diffusion coefficient of the first ions is greater than the diffusion coefficients of boron ions. A PN junction formed by means of the present invention is a gradual junction, thereby improving breakdown voltage, shortening turn-off time, and improving anti-latch capability.

5 Claims, 2 Drawing Sheets

(51) Int. Cl.
*H01L 29/739* (2006.01)
*H01L 29/10* (2006.01)

(58) Field of Classification Search
CPC ............... H01L 29/0696; H01L 29/086; H01L 29/0878; H01L 29/16088; H01L 29/1095; H01L 29/66325; H01L 29/0834; H01L 29/7375; H01L 29/7395; H01L 29/1608; H01L 29/167; H01L 29/66333–66348; H01L 29/7397; H01L 29/7398; H01L 21/02694; H01L 21/0415; H01L 21/0455; H01L 21/046–047; H01L 21/2205; H01L 21/2253; H01L 21/265–266; H01L 21/823814; H01L 21/324
USPC .................................... 257/77, 139; 438/521
See application file for complete search history.

(56) References Cited

FOREIGN PATENT DOCUMENTS

| CN | 107481929 A | 12/2017 |
| CN | 110858609 A | 3/2020 |

OTHER PUBLICATIONS

Wan, Jiqing et al., Principles of Power Transistors, Mar. 31, 2019, ISBN: 978-7-811113-491-9.
Taylor, Design and Manufacture of Thyristors, Jul. 31, 1992, ISBN: 7-113-01211-6.
Baliga, Silicon Power Field Controlled Devices and Integrated Circuits, Dec. 31, 1986, ISBN: 15033-6424.
Office Action from Chinese Application No. 201810967106.7 dated Mar. 22, 2021 (5 pages).

\* cited by examiner

IGBT AND MANUFACTURING METHOD THEREFOR

This application claims priority of Chinese patent application CN201810967106.7, filed on Aug. 23, 2018, the contents of which are incorporated herein by reference in their entirety.

FIELD OF INVENTION

The present invention relates to the technical field of semiconductor, in particular to an IGBT and manufacturing method therefor.

PRIOR ARTS

IGBT (Insulated Gate Bipolar Transistor) combines the advantages of BJT (Bipolar Junction Transistor) and power MOSFET (Metal-Oxide-Semiconductor Field-Effect Transistor), combines the advantages of high input impedance and low on-voltage drop, and it is widely used in various power integrated circuits.

However, in the current IGBT, limited by the physical properties of element boron, the PN junction formed by the diffusion of boron ions is an abrupt junction, in addition, the PN junction is related to performance such as breakdown voltage and turn-off time, furthermore, the abrupt PN junction limits the further improvement of performance of the current IGBT.

CONTENT OF THE PRESENT INVENTION

The technical problem to be solved in the present invention is for overcoming the PN junction of IGBT is an abrupt junction, hence providing an IGBT and manufacturing method therefor.

The present invention solves the above-mentioned technical problem through the following technical solutions:

An IGBT, wherein a target region in the IGBT is doped with first ions, wherein, the target region comprises at least one of a P-type substrate, a P-type well region, and a P-type source region, and the diffusion coefficient of the first ions is greater than the diffusion coefficient of boron ions.

Preferably, the first ions are selected from: aluminum ions, gallium ions, indium ions, and thallium ions.

Preferably, the target region is further doped with second ions, and the diffusion coefficient of the second ions is not less than the diffusion coefficient of boron ions.

Preferably, the first ions and the second ions are located in different layers.

Preferably, the first ions are selected from: aluminum ions, gallium ions, indium ions, and thallium ions.

The second ions are selected from: boron ions, aluminum ions, gallium ions, indium ions, and thallium ions.

Preferably, the first ions are aluminum ions, and the second ions are gallium ions.

Preferably, the contact surface between the target region and other regions in the IGBT is doped with boron ions.

A method for manufacturing IGBT, wherein, the method comprises:

Doping the target region of the IGBT with first ions, and the first ions are doped into the target region through any one of ion implantation, diffusion, evaporation, and sputtering.

Wherein, the target region comprises at least one of a P-type substrate, a P-type well region, and a P-type source region, and the diffusion coefficient of the first ions is greater than the diffusion coefficient of boron ions.

Preferably, the method further comprises:

Doping the target region with second ions, and the second ions are doped into the target region through any one of ion implantation, diffusion, evaporation, and sputtering.

Wherein, the diffusion coefficient of the second ions is not less than the diffusion coefficient of boron ions.

Preferably, the method further comprises:

Doping the contact surface between the target region and other regions in the IGBT with boron ions.

The positive improved effects of this invention are: the diffusion coefficient of doped impurities in the P-type region of the IGBT of the present invention is greater than the diffusion coefficient of boron ions, unlike the prior art that uses boron ions as doping impurities, so that the impurity distribution morphology formed under the same conditions is more gradual, that is, the formed PN junction is a gradual junction, thereby increasing the breakdown voltage, shortening the turn-off time, improving the anti-latch-up ability, and further improving the performance of the IGBT. In addition, due to the large impurity diffusion coefficient of the present invention, a wider and deeper PN junction can be formed at a lower temperature and in a shorter time, which has certain cost advantages.

DETAILED DESCRIPTION OF THE PREFERRED EMBODIMENT

The present invention will be further illustrated by the following embodiments, but the present invention is not limited thereto.

Embodiment 1

Figure 1:
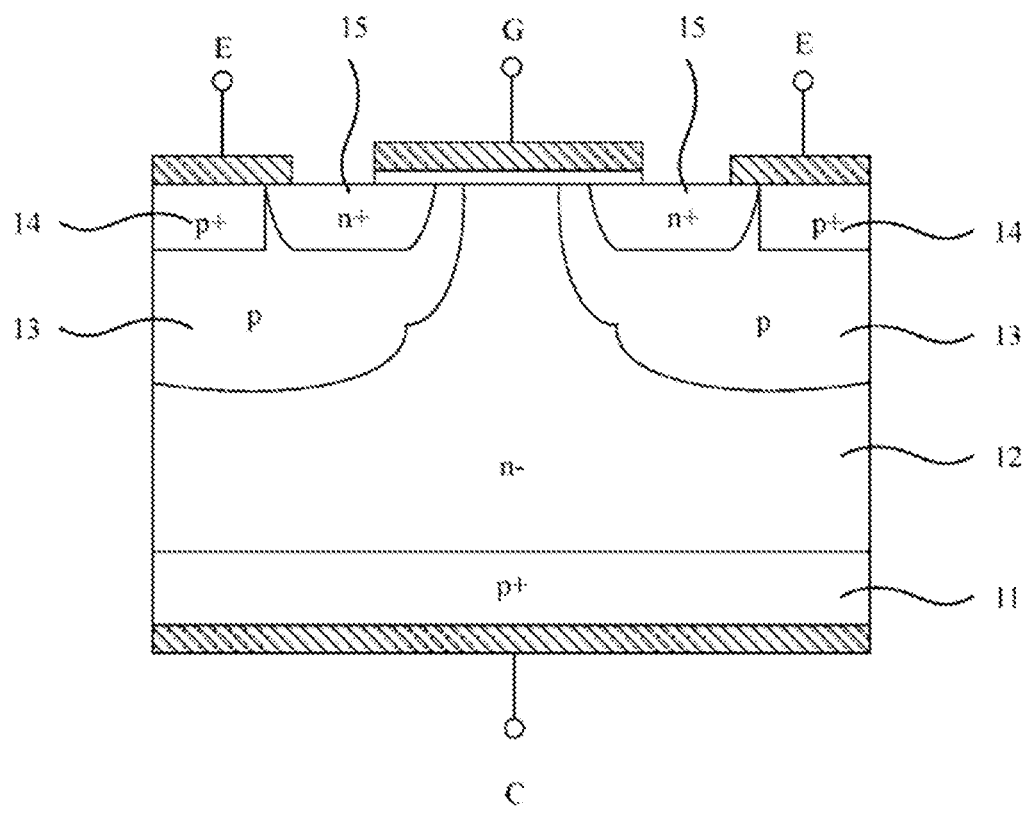
FIG. 1 is a schematic structural diagram of an IGBT according to embodiment 1 of the present invention.

This embodiment provides an IGBT, and FIG. 1 shows a schematic structural diagram of this embodiment. Referring to FIG. 1, the IGBT of this embodiment comprises from bottom to top:

A collector C on the back surface of the IGBT, a P-type substrate 11, an N-type drift region 12, a P-type well region 13 at both ends of the N-type drift region 12, a P-type source region 14 and an N-type source region 15 above the P-type well region 13, an emitter electrode E located above the P-type source region 14 and a part of the N-type source region 15, and a gate electrode G located above a part of the N-type source region 15, a part of the P-type well region 13 and a part of the N-type drift region 12.

In the IGBT of this embodiment, a target region comprises at least one of the P-type substrate 11, the P-type well region 13, and the P-type source region 14. In this embodiment, the doping impurities of the target region are first ions, which have a diffusion coefficient greater than the diffusion coefficient of boron ions. Specifically, the first ions may be, but not limited to, aluminum ions, gallium ions, indium ions, and thallium ions.

In this embodiment, the doping concentration and depth of the first ions can be customized according to specific applications.

Since the first ions as doping impurities in this embodiment are the above-mentioned metal ions, thereby boron ions can be further doped on the contact surface between the target region and other regions, in other words, a layer of boron ions is covered on the surface of the target region, to avoid metal contamination caused by doped metal ions.

In this embodiment, the diffusion coefficient of the first ions doped in the target region of the IGBT is greater than the diffusion coefficient of boron ions, unlike the prior art that uses boron ions as doping impurities, so that the impurity distribution morphology formed under the same conditions is more gradual, that is, the formed PN junction is a gradual junction, thereby increasing the breakdown voltage, shortening the turn-off time, improving the anti-latch-up ability, and further improving the performance of the IGBT. In addition, due to the large impurity diffusion coefficient of the present invention, a wider and deeper PN junction can be formed at a lower temperature and in a shorter time, which has certain cost advantages.

Embodiment 2

Figure 2:
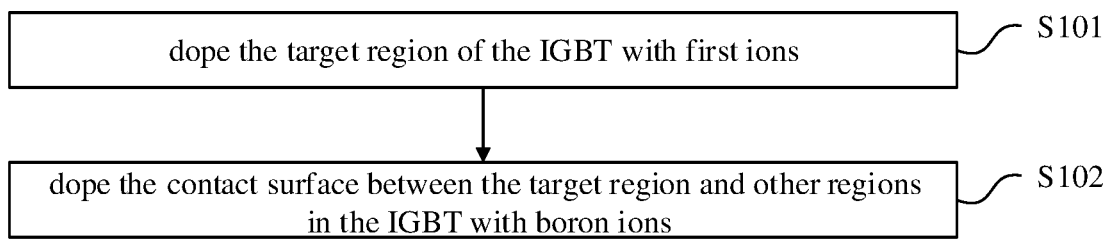
FIG. 2 is a flowchart of a method for manufacturing IGBT according to embodiment 2 of the present invention.

This embodiment provides a method for manufacturing IGBT, which is used for manufacturing the IGBT of embodiment 1, FIG. 2 shows a flowchart of this embodiment. Referring to FIG. 2, the method of this embodiment comprises:

S101, doping the target region of the IGBT with first ions;

S102, doping the contact surface between the target region and other regions in the IGBT with boron ions.

Therefore, according to the selection of the target region in embodiment 1, the corresponding P-type substrate 11, P-type well region 13, and P-type source region 14 can be specifically formed, wherein the first ions can be doped into the target region through but not limited to any one of ion implantation, diffusion, evaporation, and sputtering. In addition, boron ions can also be doped to specific contact surface through but not limited to the above-mentioned methods, to avoid metal contamination caused by doped metal ions.

Embodiment 3

This embodiment provides an IGBT on the basis of embodiment 1. Specifically, the improvement of the IGBT of this embodiment over embodiment 1 lies in that the target region of this embodiment, that is, at least one of the P-type substrate 11, the P-type well region 13, and the P-type source region 14, in addition to being doped with the first ions, it is also doped with second ions, the diffusion coefficient of the second ions is not less than the diffusion coefficient of the boron ions. Specifically, the second ions may be, but not limited to, boron ions, aluminum ions, gallium ions, indium ions, thallium ions.

In this embodiment, the first ions are preferably aluminum ions, and the second ions are preferably gallium ions, or the first ions are preferably gallium ions, and the second ions are preferably aluminum ions. In addition, the first ions and the second ions can be doped with each other, or distributed in different layers according to specific applications. The doping concentration and depth of the second ions can also be customized according to specific applications.

In this embodiment, the diffusion coefficient of the first ions and the second ions doped in the target region of the IGBT are both not less than the diffusion coefficient of boron ions, unlike the prior art that uses boron ions as doping impurities, so that the impurity distribution morphology formed under the same conditions is more gradual, that is, the formed PN junction is a gradual junction, thereby increasing the breakdown voltage, shortening the turn-off time, improving the anti-latch-up ability, and further improving the performance of the IGBT. In addition, due to the large impurity diffusion coefficient of the present invention, a wider and deeper PN junction can be formed at a lower temperature and in a shorter time, which has certain cost advantages.

Embodiment 4

Figure 3:
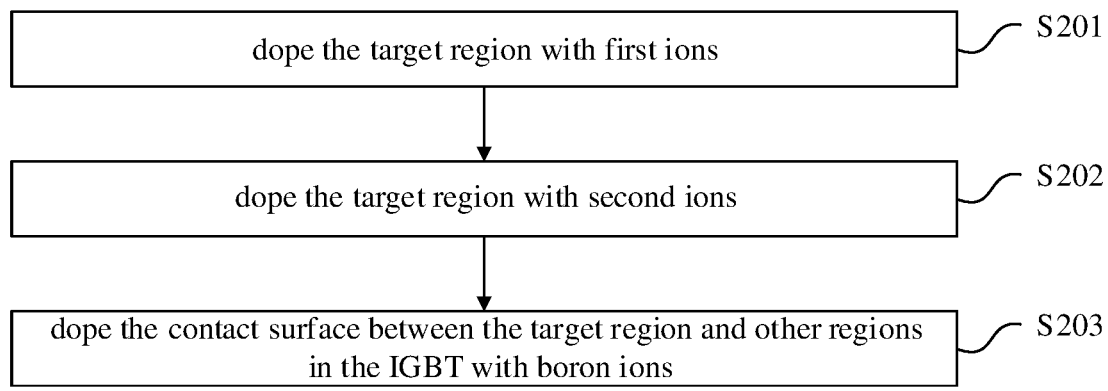
FIG. 3 is a flowchart of a method for manufacturing IGBT according to embodiment 4 of the present invention.

This embodiment provides a method for manufacturing IGBT, which is used for manufacturing the IGBT of embodiment 3, FIG. 3 shows a flowchart of this embodiment. Referring to FIG. 3, the method of this embodiment comprises:

S201, doping the target region with first ions;

S202, doping the target region with second ions;

S203, doping the contact surface between the target region and other regions in the IGBT with boron ions.

Therefore, according to the selection of the target region in embodiment 3, the corresponding P-type substrate 11, P-type well region 13, and P-type source region 14 can be specifically formed, wherein the first ions and the second ions can be doped into the target region through but not limited to any one of ion implantation, diffusion, evaporation, and sputtering. In addition, boron ions can also be doped to specific contact surface through but not limited to the above-mentioned methods, to avoid metal contamination caused by doped metal ions.

Although the specific embodiments of the present invention are described above, it should be understood by those skilled in the art that this is only an example, and the scope of protection of the present invention is defined by the appended claims. Those skilled in the art can make various changes or modifications to these embodiments without departing from the principles and essence of the present invention. Therefore, the protection scope of the present invention is defined by the appended claims.

What is claimed is:

1. A method for manufacturing an Insulated Gate Bipolar Transistor (IGBT), the method comprising:

doping a target region of the IGBT with first ions, wherein the first ions are doped into the target region through at least one of ion evaporation and sputtering;

doping the target region with second ions, wherein the second ions are doped into the target region through at least one of ion diffusion, evaporation, and sputtering; and doping a contact surface between the target region and other regions in the IGBT with boron ions, wherein the target region comprises one of a P-type substrate, a P-type well region, and a P-type source region, and a diffusion coefficient of the first ions is greater than a diffusion coefficient of boron ions, wherein a diffusion coefficient of the second ions is greater than or equal to the diffusion coefficient of boron ions, and wherein the first ions and the second ions are P-type ions.

2. The method for manufacturing an IGBT according to claim 1, wherein the first ions are selected from aluminum ions, gallium ions, indium ions, and thallium ions.

3. The method for manufacturing an IGBT according to claim 1, wherein the first ions and the second ions are located in different layers.

4. The method for manufacturing an IGBT according to claim 3, wherein:
the first ions are selected from aluminum ions, gallium ions, indium ions, and thallium ions; and
the second ions are selected from boron ions, aluminum ions, gallium ions, indium ions, and thallium ions.

5. The method for manufacturing an IGBT according to claim 4, wherein the first ions are aluminum ions, and the second ions are gallium ions.

* * * * *